(12) United States Patent
Hermes et al.

(10) Patent No.: US 11,912,565 B2
(45) Date of Patent: Feb. 27, 2024

(54) MICROMECHANICAL SENSOR UNIT AND METHOD FOR MANUFACTURING A MICROMECHANICAL SENSOR UNIT

(71) Applicant: Robert Bosch GmbH, Stuttgart (DE)

(72) Inventors: Christoph Hermes, Kirchentellinsfurt (DE); Kerrin Doessel, Stuttgart (DE); Thomas Friedrich, Moessingen-Oeschingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 498 days.

(21) Appl. No.: 17/282,331

(22) PCT Filed: Dec. 17, 2019

(86) PCT No.: PCT/EP2019/085677
§ 371 (c)(1),
(2) Date: Apr. 1, 2021

(87) PCT Pub. No.: WO2020/127283
PCT Pub. Date: Jun. 25, 2020

(65) Prior Publication Data
US 2021/0354981 A1    Nov. 18, 2021

(30) Foreign Application Priority Data

Dec. 21, 2018 (DE) .................. 102018222770.5

(51) Int. Cl.
*B81B 7/04* (2006.01)
*G01L 9/00* (2006.01)

(52) U.S. Cl.
CPC .............. *B81B 7/04* (2013.01); *G01L 9/0073* (2013.01); *B81B 2201/0264* (2013.01); *B81B 2203/0127* (2013.01); *B81B 2207/053* (2013.01)

(58) Field of Classification Search
None
See application file for complete search history.

(56) References Cited

U.S. PATENT DOCUMENTS 6,122,973 A * 9/2000 Nomura ................ G01L 9/0075
361/283.4
6,460,234 B1 10/2002 Gianchandani
(Continued)

FOREIGN PATENT DOCUMENTS

| DE | 102016107275 A1 | 10/2016 |
| EP | 3248936 A1 | 11/2017 |

(Continued)

OTHER PUBLICATIONS

International Search Report for PCT/EP2019/085677 dated Apr. 2, 2020.

*Primary Examiner* — Kristina M Deherrera
*Assistant Examiner* — Mark A Shabman
(74) *Attorney, Agent, or Firm* — NORTON ROSE FULBRIGHT US LLP; Gerard A. Messina

(57) ABSTRACT

A micromechanical sensor unit, including: a substrate and an edge layer, which is situated on the substrate and laterally frames an inner area above the substrate; at least one diaphragm, which spans the inner area and forms a covered cavity above the substrate; at least one support point, which is situated between the substrate and the diaphragm inside the cavity and attaches the diaphragm to the edge layer and/or to the at least one support point. The support point separates the diaphragm into at least one measuring area that is movable through force action and at least one reference area that is not movable through force action. The substrate and the diaphragm, inside the cavity, include electrodes, which face one another in the measuring area and the reference area.

10 Claims, 5 Drawing Sheets

(56) References Cited

U.S. PATENT DOCUMENTS

| | | | |
|---|---|---|---|
| 9,442,032 B2 | 9/2016 | Kuisma | |
| 2010/0050776 A1* | 3/2010 | Fuhrmann | G01L 9/0073 |
| | | | 73/718 |
| 2010/0192694 A1* | 8/2010 | Hammerschmidt | G01L 9/0052 |
| | | | 73/708 |
| 2013/0001550 A1* | 1/2013 | Seeger | B81C 99/0045 |
| | | | 438/15 |
| 2014/0001584 A1* | 1/2014 | Liu | B81B 3/0021 |
| | | | 257/419 |
| 2018/0105417 A1* | 4/2018 | Seddon | G01L 19/0069 |
| 2018/0113040 A1 | 4/2018 | Zheng | |

FOREIGN PATENT DOCUMENTS

| | | |
|---|---|---|
| EP | 2994733 B1 | 1/2018 |
| GB | 2383420 A | 6/2003 |
| JP | S58140446 U | 9/1983 |
| JP | H09257618 A | 10/1997 |
| JP | H10170373 A | 6/1998 |
| JP | 2015114318 A | 6/2015 |
| WO | 9812528 A1 | 3/1998 |

\* cited by examiner

MICROMECHANICAL SENSOR UNIT AND METHOD FOR MANUFACTURING A MICROMECHANICAL SENSOR UNIT

FIELD

The present invention relates to a micromechanical sensor unit and to a method for manufacturing a micromechanical sensor unit.

BACKGROUND INFORMATION

Multiple configuration options with respect to the diaphragm geometry, arrangement, diaphragm selection, and interconnection of the diaphragms are available for the implementation of a diaphragm-based sensor, e.g., a pressure sensor. The goal in the process may be to achieve that the arrangement and distribution of multiple diaphragms within a sensor core is present as a diaphragm design.

German Patent Application No. DE 10 2016 107 275 A1 describes a pressure sensor which includes multiple small pressure cells in a base area.

Furthermore, capacitive pressure sensors including a rectangular diaphragm are conventional, for example those having an aspect ratio of greater than or equal to 3:1 of the diaphragm length to the diaphragm width (See, e.g., U.S. Pat. No. 9,442,032 B2 and European Patent No. EP 2 994 733 B1).

SUMMARY

The present invention provides a micromechanical sensor unit and a method for manufacturing a micromechanical sensor unit.

Preferred refinements are described herein.

In accordance with an example embodiment of the present invention, a sensor unit is provided including one or multiple diaphragm(s), it being possible for the multiple diaphragms to be separable and/or interconnectable/linkable within a base area. The sensor unit may advantageously be characterized by an increase in the signal capacity.

Rectangular diaphragms, and advantageously their linkage within a square base area, may behave advantageously with respect to the magnitude of the signal capacity in relation to the base capacitance ($\Delta C/CO$).

According to an example embodiment of the present invention, the present invention, the micromechanical sensor unit includes a substrate and an edge layer, which is situated on the substrate and laterally frames an inner area above the substrate; at least one diaphragm, which spans the inner area and forms a covered cavity above the substrate; at least one support point, which is situated between the substrate and the diaphragm inside the cavity, and the diaphragm is attached to the edge layer and/or to the at least one support point, the support point separating the diaphragm into at least one measuring area that is movable through force action and at least one reference area that is not movable through force action, and the substrate and the diaphragm including, inside the cavity, electrodes which face one another in the measuring area and the reference area.

Such a sensor unit may be used in MEMS components, such as in pressure- or diaphragm-based sensors.

According to one preferred specific embodiment of the sensor unit of the present invention, the diaphragm encompasses multiple rectangular, polygonal or round measuring areas.

According to one preferred specific embodiment of the sensor unit of the present invention, the diaphragm includes an identical number of measuring areas and reference areas, which are interconnected to one another in the form of a Wheatstone bridge.

According to one preferred specific embodiment of the sensor unit of the present invention, it is designed as a pressure sensor.

According to one preferred specific embodiment of the sensor unit of the present invention, the support points are configured to be round, square, rectangular or polygonal in a top view onto the substrate.

According to one preferred specific embodiment of the sensor unit of the present invention, the support points revolve completely around at least one of the measuring areas at respective distances of 1 µm to 10 µm from one another.

According to one preferred specific embodiment of the sensor unit of the present invention, the edge layer and/or the support points include the same materials as the diaphragm.

According to one preferred specific embodiment of the sensor unit of the present invention, the edge layer and/or the support points are filled with an oxide.

According to one preferred specific embodiment of the sensor unit of the present invention, at least one reference area revolves laterally around the at least one measuring area.

According to an example embodiment of the present invention, in the method for manufacturing a micromechanical sensor unit, a substrate is provided, including an edge layer which is situated on the substrate and which laterally frames the inner area above the substrate; at least one support point is situated on the substrate in the inner area, which defines at least one measuring area and at least one reference area above the substrate and separates them from one another; a diaphragm is situated at the edge layer and the support point(s) so that the diaphragm is attached to the edge layer and/or the support point and spans the inner area, and a covered cavity is formed in the inner area and between the diaphragm and the substrate, and, as a result of the support points, the diaphragm is separated into at least one measuring area that is movable through force action and at least one reference area that is not movable through force action.

In one example embodiment of the present invention, the method may advantageously also be characterized by the features already mentioned in connection with the pressure sensor unit and their advantages, and vice versa.

The force action may be a pressure.

According to one preferred specific embodiment of the method of the present invention, the cavity is filled with a gas or a vacuum is generated.

According to one preferred specific embodiment of the method of the present invention, at least one measuring area is configured with a greater thickness than another measuring area.

Further features and advantages of specific embodiments of the present invention are derived from the following description with respect to the figures.

BRIEF DESCRIPTION OF THE DRAWINGS

The present invention is described in greater detail hereafter based on the exemplary embodiment shown in the figures.

In the figures, identical reference numerals denote identical or functionally equivalent elements.

DETAILED DESCRIPTION OF THE DRAWINGS

Figure 1A:
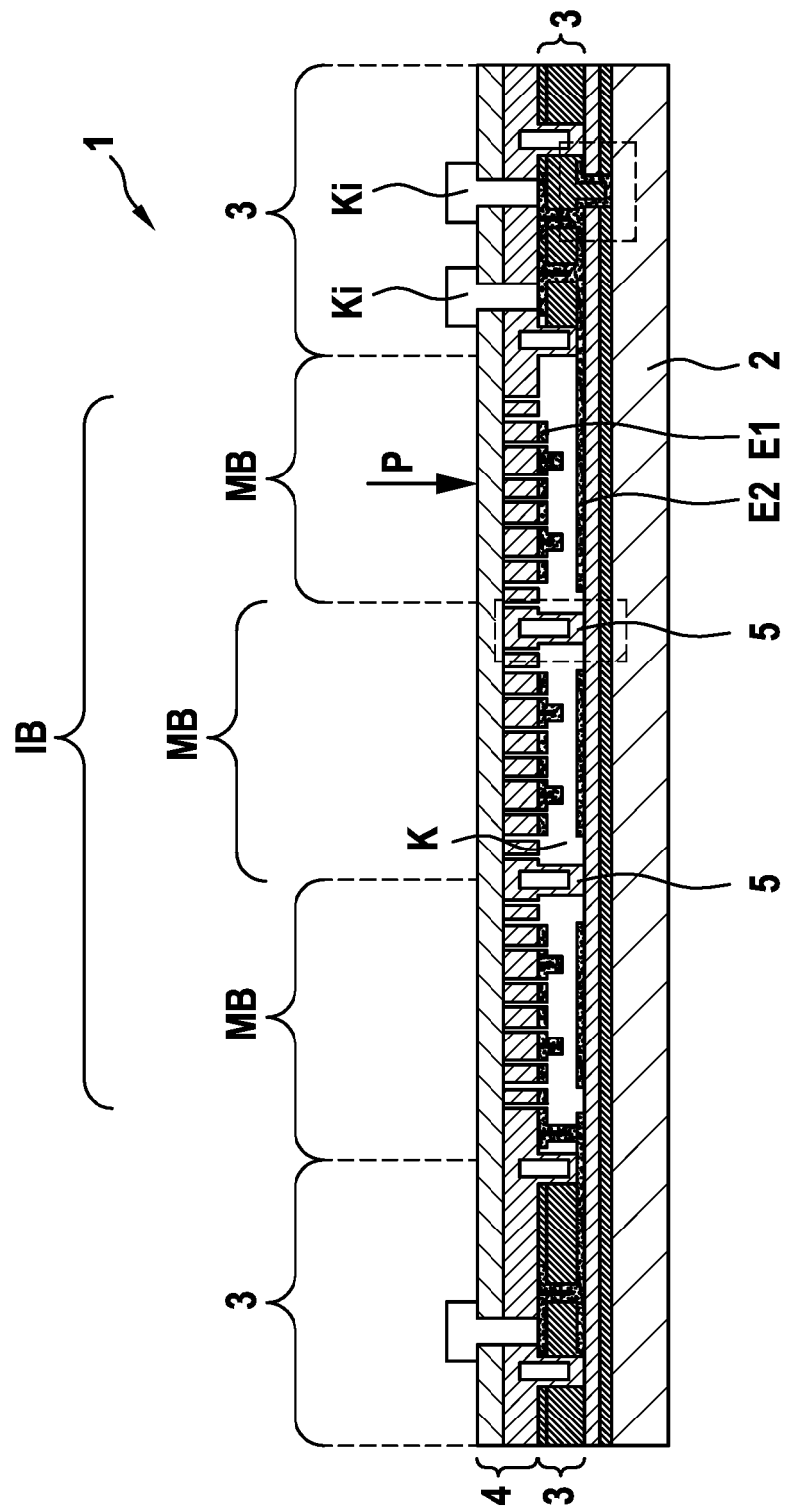
FIG. 1a shows a schematic side view of a sensor unit according to one exemplary embodiment of the present invention.

FIG. 1a shows a schematic side view of a sensor unit according to one exemplary embodiment of the present invention.

Pressure sensor unit 1 includes a substrate 2 and an edge layer 3, which is situated on substrate 2 and laterally frames an inner area IB above substrate 2, a membrane 4, which is anchored at edge layer 3 and spans inner area IB and forms a covered cavity K above substrate 2; and advantageously support points 5, which are situated between substrate 2 and diaphragm 4 inside cavity K, support points 5 separating diaphragm 4 into at least one measuring area MB that is movable by a pressure p and at least one reference area that is not movable by pressure p, and substrate 2 and diaphragm 4, inside cavity K, including electrodes E1 and E2 which face one another in measuring area MB and reference area. The edge layer may be configured as an edge area and may advantageously also encompass multiple layers.

Edge layer 3 advantageously forms the inner area as a closed cavity, advantageously as a hermetically sealed cavity.

Edge layer 3 itself may also encompass multiple layers situated on top of one another and advantageously extends vertically away from substrate 2, so that it is able to form a side wall of a cavity. Edge layer 3 may completely revolve laterally around the cavity and may even include contact points Ki as vias, to which electrodes E1 and E2 may be connected in the cavity. The electrodes may be split into a lower electrode E2 on substrate 2 and an upper electrode E1 on diaphragm 4. Support points 5 may include the material of diaphragm 4, and may advantageously include an oxide material in their interior. The support points may be made up (for example completely) of the diaphragm material, e.g., silicon, PolySi, amorphous silicon, SiN, silicon-rich nitride.

One or multiple spacer(s) (stop structure, stop knob or stopper) may be situated at the diaphragm and extend into cavity K (not shown). The spacers may include the material of the diaphragm or another material and be exposed or covered by upper electrode E1. Diaphragm 4 may also encompass multiple layers situated on top of one another or be made up of one material, such as silicon. In FIG. 1, pressure sensor unit 1 includes multiple measuring areas MB in inner area IB, which are separated by support points 5 between the measuring areas and which may correspond to a linkage of multiple membrane areas. Compared to a diaphragm which may be configured as an entire diaphragm above the cavity, multiple diaphragm areas (measuring areas) together may have a smaller total area than the base area of an individual diaphragm. Even though a smaller capacitive area may result in the process than in the case of the individual diaphragm (individual capacitances), multiple measuring areas MB, as a result of the division of cavity K and the diaphragm, may share a cavity and its, advantageously hermetically sealed, volume, by which advantages with respect to the stability of the enclosed pressure in cavity K with respect to outgassing or with respect to temperature changes may be achievable. A gas, a residual gas from the manufacturing process or a vacuum may be present in the cavity. Multiple measuring areas (diaphragm areas) in this arrangement may share a hermetically sealed cavity, in particular, precisely one cavity, which may be formed by the substrate, the side walls (edge layer) and the upper diaphragm layer.

In this overall arrangement, individual diaphragms, such as for example the measuring areas (diaphragm areas), may be implemented by the corresponding arrangement of support points (diaphragm areas may be separated from one another by the support points), which may selectively connect the substrate to the diaphragm. The stiffening effect of the support points makes multiple individual diaphragms (measuring areas, diaphragm areas) possible inside a hermetically sealed space.

Support points 5 may each have the same shape or different shapes. Support points 5 may even configured to be rectangular, for example as a cuboid, for example include combinations of differently large cuboids (not shown), a core and an enveloping material, for example the diaphragm material as the envelope, or may be manufactured from only one material. Furthermore, other shapes are also possible, for example forming a round shape (circular, elliptic) in the horizontal cross section, a rectangle, a polygon, a triangle or others, for example a cross, or, in the vertical direction, a tapered shape or cone shape having a certain opening angle toward the top or bottom, so that the side flank of the support point with the diaphragm and/or the substrate may deviate from a right angle. The support points may revolve laterally around measuring area MB partially or completely. The measuring area may also be surrounded and delimited by edge layer 3 as a side wall on at least one side.

The base area of diaphragm 4 in inner area IB, in which measuring areas MB may be configurable, may be 350×350 µm, for example. Within such a base area, different diaphragm configurations are possible, for example an individual measuring area, which may be rectangular or round, or multiple measuring areas, which may also be round or rectangular, for example multiple square diaphragm areas in the measuring areas having side lengths up to approximately 160×160 µm; or a round measuring area having a diameter of up to 350 µm, or multiple round measuring areas, each having a diameter of up to approximately 160 µm, or multiple rectangular measuring areas having side lengths up to approximately 320 µm, and side length ratios of greater than 2:1. For this purpose, additionally also the same number of reference areas RB may be present.

Diaphragm 4 may include silicon (or PolySi, amorphous Si), for example. Diaphragm 4 may also include a combination made up of an insulating silicon-rich nitride layer (SiRiN) including a conducting PolySi electrode layer. In the case of polysilicon, poly advantageously refers to a crystal growth, in contrast to amorphous or monocrystalline Si.

Diaphragm 4 may include at least one or multiple etch hole(s) above measuring areas MB in order to expose diaphragm 4 in this area.

Figure 1B:
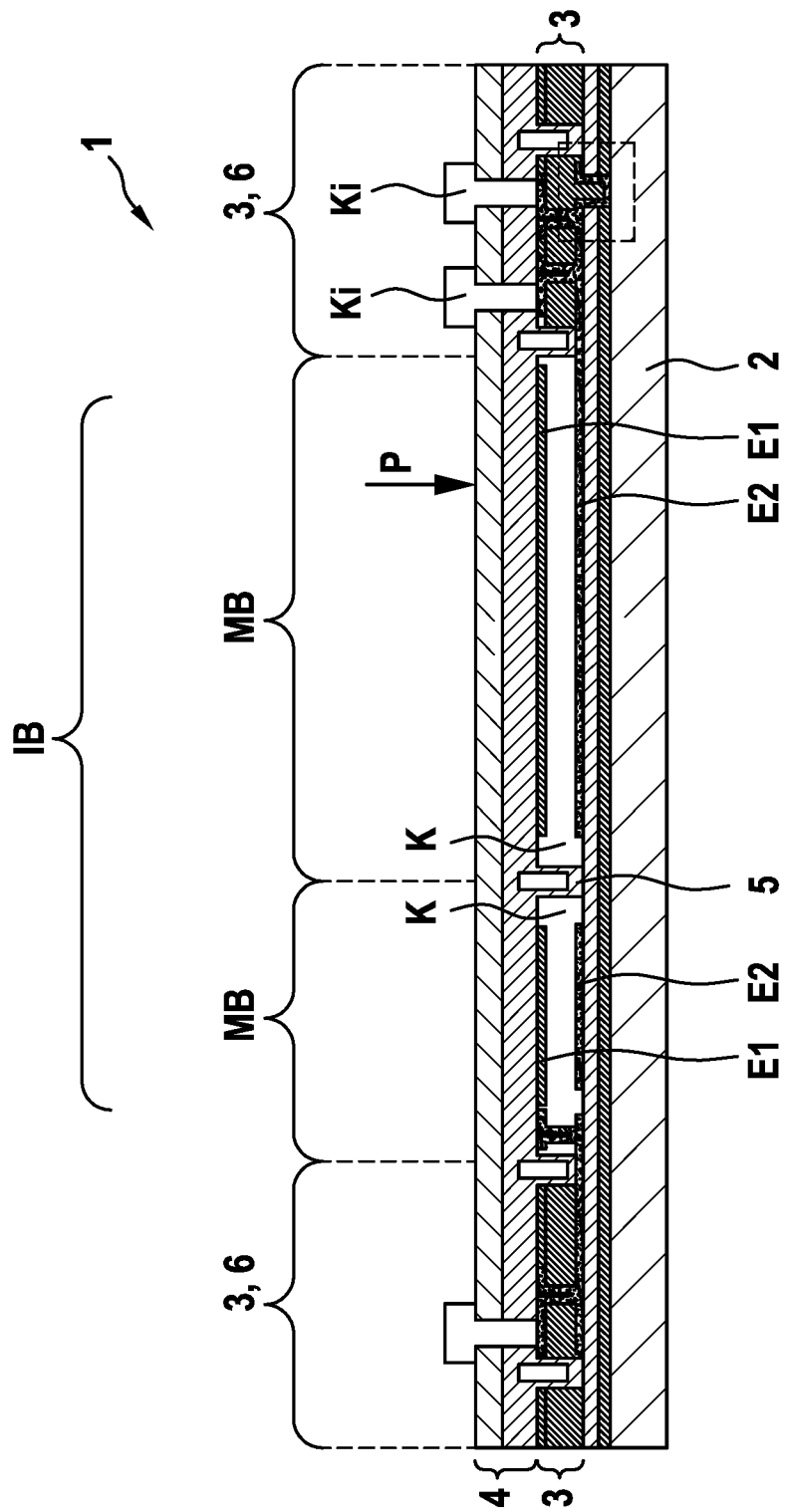
FIG. 1b shows a schematic side view of a sensor unit according to another exemplary embodiment of the present invention.

FIG. 1b shows a schematic side view of a sensor unit according to another exemplary embodiment of the present invention.

The design of FIG. 1b differs from that of FIG. 1a only in that the sensor unit, advantageously pressure sensor unit 1, only includes one support point 5, which may divide the inner area into two diaphragm areas/measuring areas (MB). Diaphragm 4 may thus be attached in the outer area (edge) in edge area 3, and on the other side, i.e., inside the cavity, at support point 5. Diaphragm 4 may be configured as at least one diaphragm and, for example, may be configured as a continuous layer. The edge layer may represent a diaphragm mount 6 at the lateral outer edge, which may be fixedly connected to substrate 2. The spacers at the diaphragm may be present (not shown), or they may be dispensed with.

Figure 2:
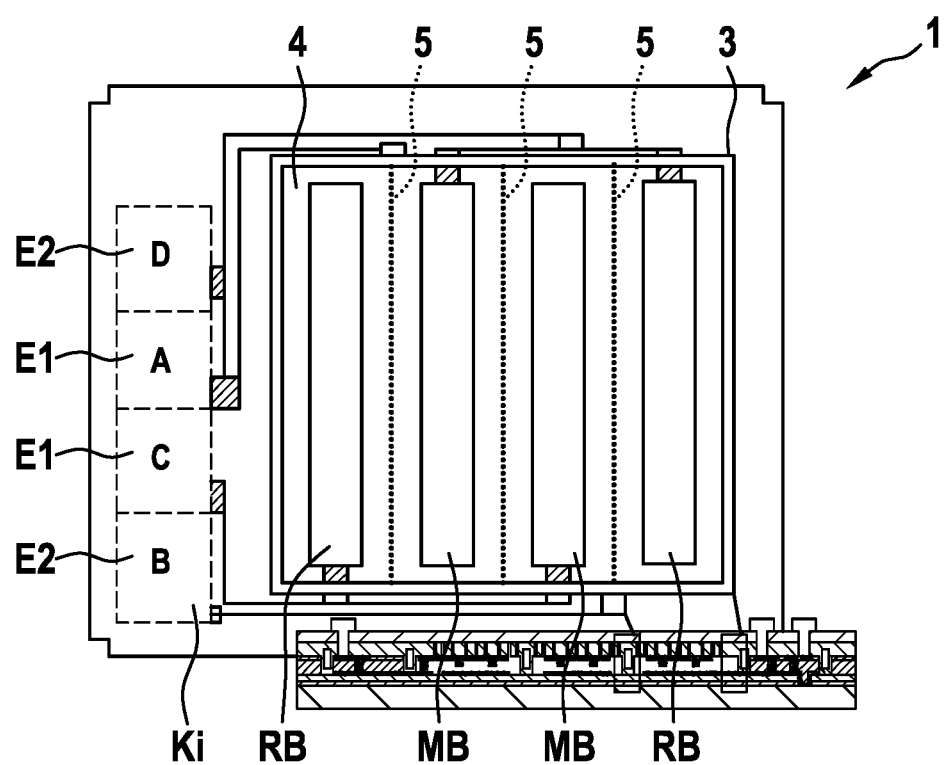
FIG. 2 shows a schematic top view onto a diaphragm of the sensor unit according to one exemplary embodiment of the present invention.

FIG. 2 shows a schematic top view onto a diaphragm of the sensor unit according to one exemplary embodiment of the present invention.

FIG. 2 shows a possible layout of a division of diaphragm 4 into four rectangular areas, it being possible for two of these to be designed as measuring areas MB and two as reference areas RB and to have a smaller base area than diaphragm 4 inside edge layer 3. According to FIG. 4, the measuring areas and the reference areas may differ in that the measuring areas include an exposed diaphragm, which is able to bend in the measuring area as a result of pressure p, and the reference areas may be underlaid with a sacrificial layer or another material. Upper electrodes E1 at the reference and measuring areas may be contacted by outer contacts A and B (for example as feed lines) and be guided over edge layer 3. Lower electrodes E2 at the reference and measuring areas may be contacted by outer contacts C and D and be guided over edge layer 3. Support points 5 may separate measuring areas MB from one another and from reference areas RB and extend along parallel lines between two opposing side walls of edge layer 3. The support points may each have a distance d of 10 μm to 50 μm from one another. The two measuring areas MB may rest directly against one another and share a cavity K. The diaphragm surfaces of the measuring areas or reference areas may, for example, each be 300 μm×80 μm and may include a half width of an area of 15 μm.

The bottom image section shows the corresponding side view of sensor unit 1.

Figure 3:
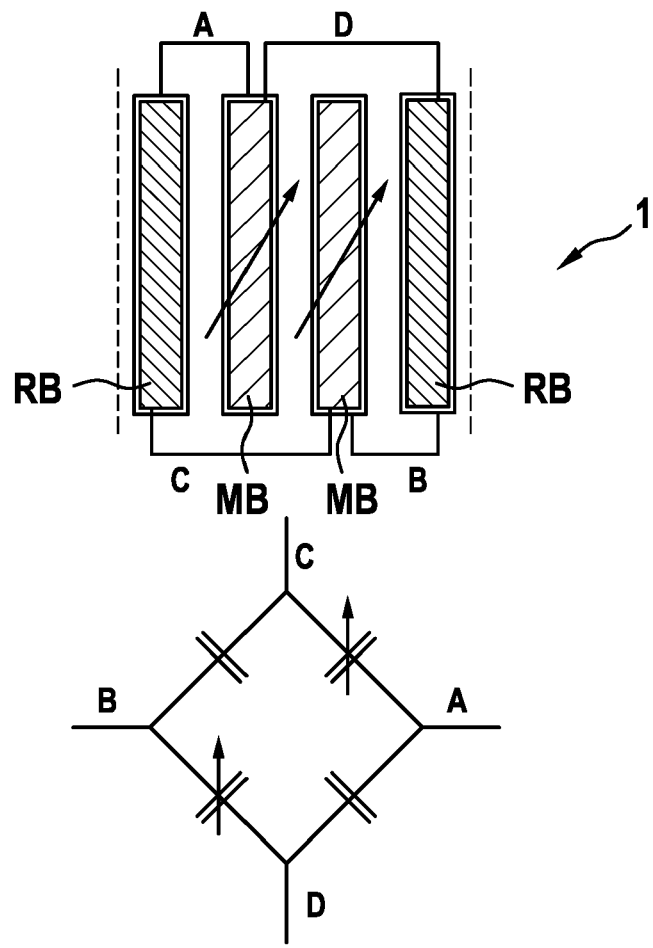
FIG. 3 shows a circuit diagram of a sensor unit according to one exemplary embodiment of the present invention.

FIG. 3 shows a circuit diagram of a sensor unit according to one exemplary embodiment of the present invention.

Measuring areas MB and reference area RB may advantageously be interconnected to one another in a Wheatstone bridge. For this purpose, an identical number of measuring areas MB and reference areas RB is advantageously present, which may all have essentially the same capacitance. Outer electrodes A, B, C, and D correspond to FIG. 2, for example, as does the assignment of measuring areas MB and reference areas RB. The interconnection to outer electrodes A, B, C, and D and measuring and reference areas MB and RB may also be different, as shown in the lower image.

Figure 4:
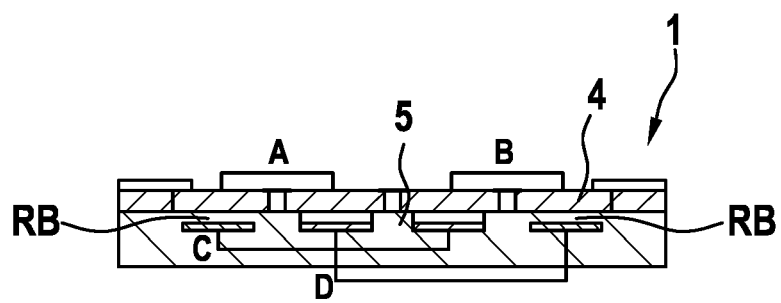
FIG. 4 shows a schematic side view of a sensor unit according to another exemplary embodiment of the present invention.

FIG. 4 shows a schematic side view of a sensor unit according to another exemplary embodiment of the present invention.

FIG. 4 shows the side view of the arrangement from FIG. 3 (having a connection according to the upper or lower image), it being possible for measuring areas MB to each include an exposed diaphragm 4, for example from an etching process, and for reference areas RB to not have any exposure of the diaphragm, and to thus essentially be immovable as a result of the pressure at diaphragm 4, which may deflect measuring areas MB. Outer electrodes A, B, C, and D correspond to FIG. 2, for example, as does the assignment of measuring areas MB and reference areas RB. Two adjoining measuring areas MB may also share a volume of a cavity, it being possible for a connection to be present between support points 5 (not shown).

The diaphragm may, for example, have a base area of 320 μm×80 μm and include a layer made up of SiRiN. As an alternative, it may also include at least one layer of silicon, PolySi, or a combination with other materials, such as for example SiN, SiO.

Figure 5:
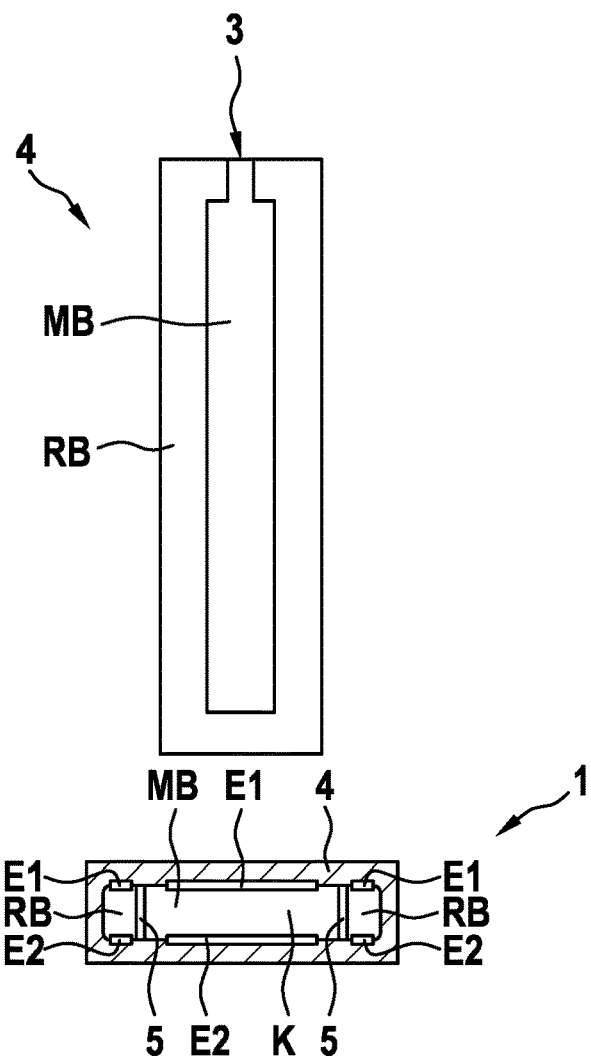
FIG. 5 shows a schematic top view onto a diaphragm and a side view of a cavity according to one exemplary embodiment of the present invention.

FIG. 5 shows a schematic top view onto a diaphragm and a side view of a cavity according to one exemplary embodiment of the present invention.

According to a different division of diaphragm 4 into reference and measuring areas MB, reference area RB may also revolve laterally around measuring area MB, for example completely. The outer areas of a diaphragm 4, which may be connected to the fixed base at or outside the edge layer, may in general deflect less than the area in the center of the diaphragm, by which an arrangement of reference areas revolving laterally around the measuring areas using support points may be possible, regardless of the diaphragm geometry (revolving capacitance areas may surround the measuring area). Support points 5 may thus represent a mechanical reinforcement of reference areas RB. The support points may, for example, have a diameter of 2 μm to 20 μm and, for example, be round. As an alternative, the support points may also encompass cuboids or rectangles (top view) having a side length in the range of 1 μm to 20 μm. In their interior, the support points may include a core made up of oxide, and sheath the core, simply filled support points having an exemplary diameter of the support point of 2 μm, or doubly filled support points having an exemplary diameter of the support point of 8 μm. Reference areas RB may also have capacitances different from the measuring areas. In FIG. 5, a connection of measuring area MB to edge layer 3 is shown in the upper area. In the process, the connection may only be at the level of the electrode, and the reference area, as the diaphragm, may nonetheless revolve completely around the measuring area above the electrode (not shown). The lower area of FIG. 5 shows a side cross section of pressure sensor unit 1, in which support points 5 may separate reference areas RB and measuring area MB from one another. Edge layer 3 may laterally adjoin the cavity and the reference area to the outside (not shown in the lower illustration). In reference areas RB and in the measuring area, lower electrodes E2 may be situated at substrate 2, and upper electrodes E1 may be situated at diaphragm 4. The volume which is advantageously hermetically sealed in cavity K may also be increased in this case. However, it is also possible for edge layers outside the diaphragm to be provided with the cavity. In this way, advantages may also be achieved in this case regarding the stability of the enclosed pressure, with respect to an outgassing, or for stability with respect to temperature changes.

Figure 6:
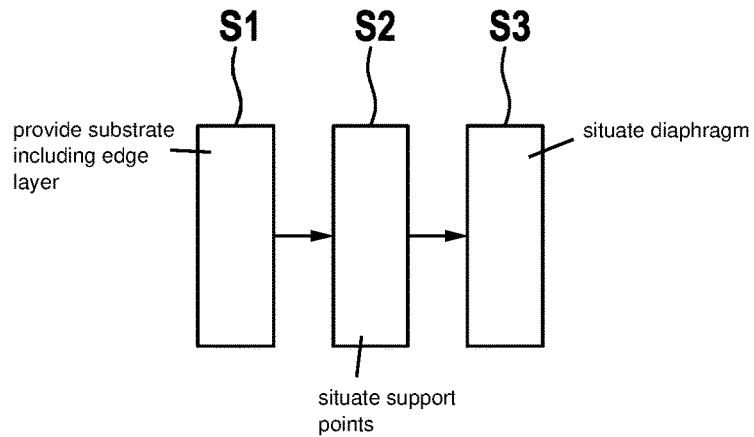
FIG. 6 shows a schematic block diaphragm of a method for manufacturing a sensor unit according to one exemplary embodiment of the present invention.

FIG. 6 shows a schematic block diagram of a method for manufacturing a sensor unit according to one exemplary embodiment of the present invention.

In the method for manufacturing a sensor unit (advantageously a pressure sensor unit), a substrate is provided S1, including an edge layer which is situated on the substrate and which laterally frames the inner area above the substrate; support points are situated S2 on the substrate in the inner area, which define at least one measuring area and at least one reference area above the substrate and separate them from one another; a diaphragm is situated S3 at the edge layer and the support points so that the diaphragm is anchored at the edge layer and spans the inner area, and a covered cavity is formed in the inner area and between the diaphragm and the substrate, and, as a result of the support points, the diaphragm is separated into at least one measuring area that is movable through pressure (force action) and at least one reference area that is not movable through pressure.

Although the present invention has been completely described above based on the preferred exemplary embodiment, it is not limited thereto, but is modifiable in a variety of ways.

What is claimed is:

1. A micromechanical sensor unit, comprising:
   a substrate, and an edge layer which is situated on the substrate and laterally frames an inner area above the substrate;
   at least one diaphragm which spans the inner area and forms a covered cavity above the substrate; and
   a plurality of support points, situated between the substrate and the diaphragm inside the cavity, the diaphragm being attached to the edge layer and to the plurality of support points, the support points separating the diaphragm into plurality of measuring areas that are movable through a pressure and plurality of reference areas that are not movable through the pressure;
   wherein the substrate and the diaphragm, inside the cavity, include electrodes which include an upper electrode and a lower electrode, the electrodes being in the measuring area and the reference area,
   wherein the diaphragm includes multiple rectangular, or polygonal, or round measuring areas,
   wherein the diaphragm includes an identical number of measuring areas and reference areas, which are interconnected with one another in the form of a Wheatstone bridge,
   wherein one of the plurality of support points separates one of the measuring areas from an adjacent one of the measuring areas, and at least another of the plurality of support points separates one of the measuring areas from one of the reference areas and extend along parallel lines between two opposing side walls of the edge layer.

2. The sensor unit as recited in claim 1, wherein the support points, in a top view onto the substrate, are configured to be round, square, rectangular or polygonal.

3. The sensor unit as recited in claim 1, wherein the support points are around at least one of the measuring areas at respective distances of 1 μm to 10 μm from one another.

4. The sensor unit as recited in claim 1, wherein the edge layer and/or the support points include the same material as the diaphragm.

5. The sensor unit as recited in claim 1, wherein the edge layer and/or the support points is filled with an oxide.

6. The sensor unit as recited in claim 1, wherein at least one reference area runs laterally around at least one measuring area.

7. The sensor unit as recited in claim 1, wherein the sensor unit is a pressure sensor.

8. A method for manufacturing a micromechanical sensor unit, the method comprising
   providing a substrate including an edge layer, which is situated on the substrate and which laterally frames an inner area above the substrate;
   situating plurality of support points on the substrate in the inner area, which define plurality of measuring areas and plurality of reference areas above the substrate, the support points separating the measuring and reference areas from one another; and
   situating a diaphragm at the edge layer and the support point, so that the diaphragm is attached to the edge layer and/or to the support point and spans the inner area, a covered cavity being formed in the inner area between the diaphragm and the substrate, and, as a result of the support point, the diaphragm is separated into at least one measuring area that is movable through a pressure force action and at least one reference area that is not movable through the pressure;
   wherein the substrate and the diaphragm include electrodes, which include an upper electrode and a lower electrode, the electrodes being in the measuring area and the reference area,
   wherein the diaphragm includes multiple rectangular or polygonal or round measuring areas,
   wherein the diaphragm includes an identical number of measuring areas and reference areas, which are interconnected with one another in the form of a Wheatstone bridge,
   wherein one of the plurality of support points separates one of the measuring areas from an adjacent one of the measuring areas, and at least another of the plurality of support points separates one of the measuring areas from one of the reference areas and extend along parallel lines between two opposing side walls of the edge layer.

9. The method as recited in claim 8, wherein the cavity is filled with a gas or a vacuum is generated.

10. The method as recited in claim 8, wherein at least one measuring area is configured with a greater thickness than another measuring area.

* * * * *